United States Patent [19]

Höppner et al.

[11] 4,266,100

[45] May 5, 1981

[54] MONOLITHICALLY INTEGRATED SEMICONDUCTOR CIRCUIT

[75] Inventors: Dietrich Höppner, Blaustein-Wippingen; Gerhard Kohlbacher, Ulm, both of Fed. Rep. of Germany

[73] Assignee: Licentia Patent-Verwaltungs-G.m.b.H., Frankfurt am Main, Fed. Rep. of Germany

[21] Appl. No.: 21,973

[22] Filed: Mar. 19, 1979

[30] Foreign Application Priority Data

Mar. 17, 1978 [DE] Fed. Rep. of Germany ....... 2811631

[51] Int. Cl.³ .................. H01L 29/70; H04Q 3/52
[52] U.S. Cl. ..................... 179/18 GF; 307/299 B; 357/36
[58] Field of Search .............. 179/18 GF; 357/36; 307/299 B, 241; 340/166 R

[56] References Cited

U.S. PATENT DOCUMENTS

| 4,054,898 | 10/1977 | Streit et al. | 357/36 |
| 4,130,826 | 12/1978 | Bachle et al. | 357/34 |

Primary Examiner—Thomas W. Brown
Attorney, Agent, or Firm—Spencer & Kaye

[57] ABSTRACT

A monolithically integrated semiconductor circuit, provided for coupling arrangements having symmetrical cross points, comprising two through switching NPN transistors, and a composite circuit for switching through the switching transistors. The composite circuit includes a double collector PNP transistor, with one collector connected to the base of a first NPN transistor and the other collector connected to the base of a second NPN transistor. The emitter of the double collector transistor is connected to the collector of both NPN transistors and also, via a first resistor to a voltage source. The base of the double collector transistor is connected, via a component causing a constant drop in voltage, to the voltage source, and also via a second resistor, to a trigger stage. The emitters of the NPN transistor are connected, respectively, to the bases of the two through switching transistors.

2 Claims, 5 Drawing Figures

MONOLITHICALLY INTEGRATED SEMICONDUCTOR CIRCUIT

BACKGROUND OF THE INVENTION

The invention relates to a monolithically integrated semiconductor circuit having a plurality of low resistance through switching transistors in bipolar technology for use in coupling arrangements with symmetrical cross points for telephone connection and transmission devices which permit a series of incoming lines to be connected selectively to one or more outgoing lines. In one such case, the two through switching transistors of a symmetrical cross point are constructed as NPN transistors, can be switched through in a high resistance manner by means of a composite circuit and can be blocked in low resistance manner by means of an additional circuit and both the composite circuit and the additional circuit can be triggered by means of a memory constructed as a trigger stage.

This type of semiconductor circuit which can be carried out simply in integrated injection logic circuit technology (I$^2$L circuits) is known from German Offenlegungsschrift No. 25 55 047 corresponding to U.S. Pat. No. 4,130,826.

SUMMARY OF THE INVENTION

It is an object of the invention to refine a semiconductor circuit of the type mentioned at the outset so that the circuitry provided once for each symmetrical cross point requires a small semiconductor space without limiting its functioning, so that either the coupling components can be made smaller or more cross points can be accommodated per coupling component.

According to a first aspect of the invention, there is provided a monolithically integrated semiconductor circuit for coupling arrangements having symmetrical cross points comprising two through switching NPN transistors; a composite circuit for switching through the through switching transistors, including a double collector PNP transistor, a first NPN transistor having its base connected to a first collector of the double collector transistor, a second NPN transistor having its base connected to the second collector of the double collector transistor, connections between the emitter of the double collector transistor to the collectors of said first and second NPN transistors, a resistor connecting the emitter of said double collector transistor to a voltage source, a component causing a constant voltage drop connected between the base of the double collector transistor to said voltage source, a second resistor connected to the base of the double collector transistor and connections between the emitters of the first and second NPN transistors and the bases of the through switching transistors; an additional circuit for blocking the through switching transistors in cooperation with said composite circuit; and a trigger stage memory circuit for triggering the additional circuit and connected to the second resistor of the composite circuit.

Further according to this aspect of the invention, there is provided a monolithically integrated semiconductor circuit having a plurality of low resistance through switching transistors in accordance with bipolar technology for use in coupling arrangements having symmetrical cross points for telephone connection and transmission devices, which permits a series of incoming lines to be selectively connected to one or more outgoing lines in which the two through switching transistors respectively of a symmetrical cross point are constructed as NPN transistors and can be switched through in a high resistance manner by a composite circuit and can be blocked in low resistance manner by an additional circuit and the composite circuit and the additional circuit can be triggered by a memory constructed as a trigger stage, characterized in that the composite circuit has a double collector transistor of PNP type a collector of which is connected to the base of a first NPN transistor, the other collector being connected to the base of a second NPN transistor, its emitter being connected, on the one hand, to the collectors of both NPN transistors and on the other hand via a first resistor to a voltage source and its base being connected, on the one hand, via a component causing a constant drop in voltage to the voltage source and, on the other hand, via a second resistor to the trigger stage and the emitters of the two NPN transistors respectively are connected to the base of the two through switching transistors.

According to a second aspect of the invention, there is provided a monolithically integrated semiconductor circuit for coupling arrangements having symmetrical cross points comprising two through switching NPN transistors; a composite circuit for switching through the through switching transistors; an additional circuit for blocking the through switching transistors in cooperation with the composite circuit and including an NPN double collector transistor, each collector of the double collector transistor being connected to to a base of one of the through switching transistors, first and second PNP transistors connected in series with their bases connected to a reference potential, the collector of the first PNP transistor being connected to the base of the double collector transistor, the emitter of the first PNP transistor being connected to the collector of the second PNP transistor and the emitter of the second PNP transistor being connected to an injector line; and a trigger stage memory circuit for triggering the additional circuit and connected to the emitter of the first PNP transistor.

Further according to this aspect of the invention, there is provided a monolithically integrated semiconductor circuit having a plurality of low resistance through switching transistors in accordance with bipolar technology for use in coupling arrangements of telephone connection and transmission devices which permit a series of incoming lines to be connected to one or more outgoing lines selectively, in which two through switching transistors of a symmetrical cross point are constructed as NPN transistors and can be switched through in high resistance manner by means of a composite circuit and can be blocked by means of an additional circuit in low resistance manner and both the composite circuit and the additional circuit can be triggered by means of a memory constructed as a trigger stage whereby the additional circuit has a double collector transistor of the NPN type which is connected to a collector in each case at the respective base of the two through switching transistors, characterized in that a series connection of two PNP transistors the bases of which are both at reference potential is provided in which the collector of the first PNP transistor is connected to the base of the double collector transistor, the emitter of the first PNP transistor is connected to the trigger stage and to the collector of the second PNP transistor and the emitter of the second PNP transistor is connected to an injector line.

BRIEF DESCRIPTION OF THE DRAWINGS

The invention will now be described in greater detail, by way of example, with reference to the drawings in which.

DESCRIPTION OF THE PREFERRED EMBODIMENTS

In a preferred embodiment of the invention, in a monolithically integrated semiconductor circuit, provided for coupling arrangements having symmetrical cross points, comprises two through switching NPN transistors, a composite circuit for switching through the switching transistors, an additional circuit for blocking the through switching transistors in cooperation with the composite circuit and a trigger stage memory circuit for triggering the additional circuit, the composite circuit comprises a double collector PNP transistor, a first NPN transistor having its base connected to a first collector of said double collector transistor, a second NPN transistor having its base connected to the second collector of the double collector transistor, the emitter of the double collector transistor being connected to the collectors of the first and second NPN transistors, a resistor connecting the emitter of the double collector transistor to a voltage source, a component causing a constant voltage drop connected between the base of the double collector transistor to the voltage source, a second resistor connected to the base of the double collector transistor, the emitters of the first and second NPN transistors being connected to the bases of the through switching transistors, and the additional circuit comprises an NPN double collector transistor, each collector of the double collector transistor being connected to a base of one of the through switching transistors, first and second PNP transistors connected in series with their bases connected to a reference potential, the collector of the first PNP transistor being connected to the base of the double collector transistor, the emitter of the first PNP transistor being connected to the collector of the second PNP transistor and the emitter of the second PNP transistor being connected to an injector line. The interface circuit and thus the entire semiconductor circuit can now be manufactured in an extremely space-saving manner in the technology for I²L circuits.

The composite circuit contains fewer elements and the two transistors Tn72 and Tn82 can be jointly arranged in an insulation box in advantageous manner in the technology for I²L circuits. As a result the saving in surface area for the composite circuit is approximately 40%.

A PNP transistor, which in the known circuit, can be manufactured in the technology for I²L circuits only as a lateral transistor which takes up a lot of space, is formed by two PNP transistors, both base connections of which are at reference potential so that they can be joined together and as a result can be integrated in the I²L logic, without additional diffusion of the insulation. The space requirement of the two PNP transistors is only approximately 0.005 mm² and is therefore approximately 65% smaller than that of the equivalent lateral transistor.

Figure 1:
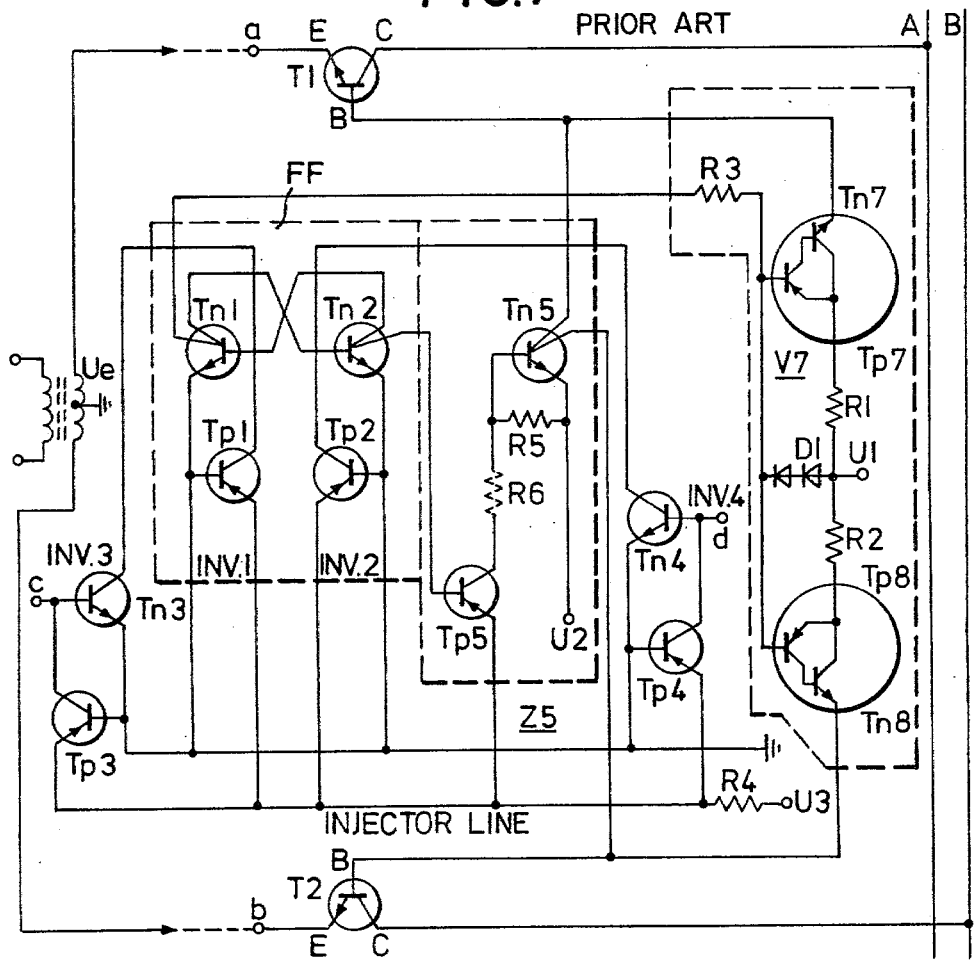
FIG. 1 shows a known circuit.

FIG. 1 shows a known circuit on which the embodiments of the invention are based. In FIG. 1 T1 and T2 are the two through switching transistors of NPN type of a symmetrical cross point having input leads a and b and output leads A and B. The emitter side of the through switching transistors is connected to reference potential (earth) via a transformer Ue. The through switching transistors can be connected at their base by an interface circuit comprising a composite circuit V7 and an additional circuit Z5. The interface circuit is triggered by a memory constructed as a trigger stage, FF, its respective stable position being determined by a logic circuit element applied to the terminals c and d.

The composite circuit V7 has two parts which can be produced by techniques for I²L circuits in the known symmetrical cross point. Each part, for example the upper part in FIG. 1, encompasses two transistors Tn7 and Tp7 of opposite type of conductivity, the NPN transistor Tn7 of which is connected by its emitter to the base of the through switching transistor T1 and by its base to the collector of the PNP transistor Tp7 and by its collector on the one hand to the emitter of the PNP transistor Tp7 and on the other hand via a resistor R1 to a first voltage source U1, whose voltage is selected so that it can switch on the through switching transistor T1 via the composite circuit. The PNP transistor Tp7 is connected by its base on the one hand to a second resistor R3 and on the other hand via a component D1 causing a constant drop in voltage, for example two diodes operating in the forward direction to the first voltage source U1.

This composite circuit has the task of acting as a high resistance current source switching on the associated through switching transistor in order to achieve minimum cross damping of the cross point in one position of the trigger stage.

In the other position of the trigger stage, the additional circuit Z5 begins to function and blocks the through switching transistors T1 and T2 in low resistance manner at the base for the purpose of achieving optimum reverse damping of the cross point.

The additional circuit Z5 comprises a PNP transistor Tp5 which is produced by I²L circuit technology, this PNP transistor being connected by its base to a collector of the transistor Tn2 of the two NPN transistors of the trigger stage FF and also comprises an NPN transistor Tn5 which is connected by its base, on the one hand, by a third resistor R5 and by its emitter directly to a second voltage source U2 and, on the other hand, by its base directly or via a fourth resistor R6 to the collector of the PNP transistor Tp5 and is connected by its collector to the base of the through switching transistor T1.

Figure 2:
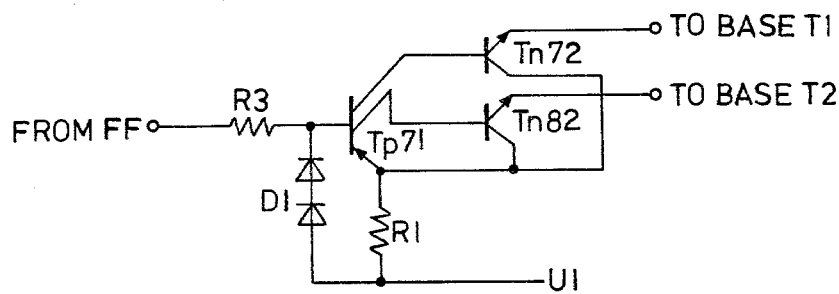
FIG. 2 shows a composite circuit for high resistance triggering for the purpose of through switching the two through switching transistors of a symmetrical cross point.

The refined composite circuit of the invention for high resistance triggering for the purpose of switching on the two through switching transistors T1 and T2 of the symmetrical cross point shown in FIG. 1 is shown in FIG. 2. The composite circuit has a double collector transistor Tp71 of the PNP type, a collector of which is connected to the base of a first NPN transistor Tn72, whose other collector is connected to the base of a second NPN transistor Tn82, its emitter, on the one hand, being connected to the collectors of the two NPN transistors Tn72 and Tn82 and, on the other hand, being connected via a first resistor R1 to a voltage source U1. Its base is connected on the one hand via a component D1 causing a constant drop in voltage, two diodes operating in the forward direction in this embodiment, to the voltage source U1 and, on the other hand, via a second resistor R3 to the trigger circuit FF. The emitters of the two NPN transistors Tn72 and Tn82 are connected respectively to the bases of the two through switching transistors T1 or T2 respectively.

The voltage source U1 serves to connect the through switching transistors conductively as in the circuit according to FIG. 1. If the trigger circuit FF is blocked, then no current flows through the resistor R3 or the diodes D1 and the voltage between the base and the emitter of the double collector transistor Tp71 is zero so that the latter and also the two transistors Tn72 and Tn82 are blocked.

If on the other hand the trigger stage FF is conductive, then, as a result of the current through the diodes D1 and the resistor R3, a voltage is formed at the two diodes controlling the transistor Tp71.

The current through the transistor Tp71 is determined predominantly by the drop in voltage across the two diodes D1 and the resistor R1 so that approximately 1 mA flows through the resistor R1 at R1=500 ohms. In each case, 0.5 mA are available for switching and holding the through switching transistors T1 and T2 in the switched-on condition.

Figure 3:
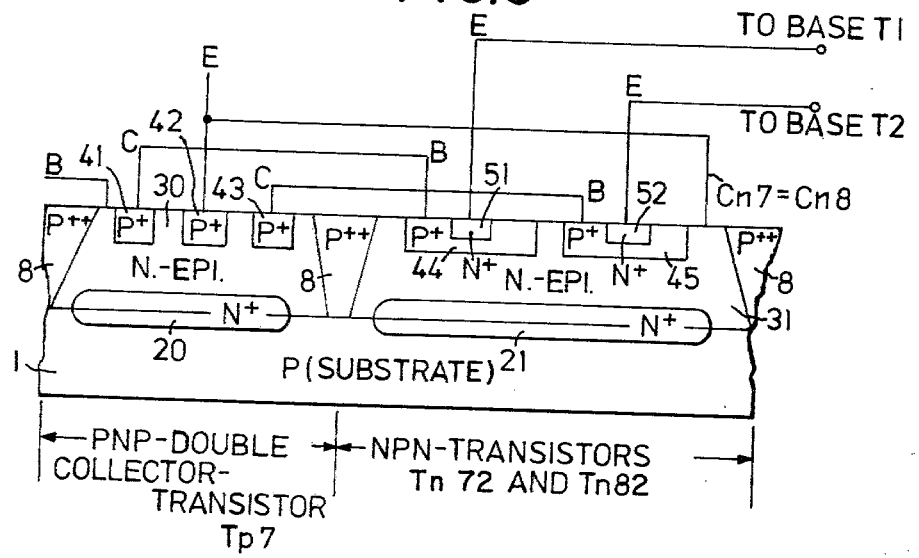
FIG. 3 shows a technological construction of the composite circuit shown in FIG. 2.

In FIG. 3 the technological construction of the transistors Tp71, Tn72 and Tn82 is shown in I²L technology. A N-epi-layer 31 is applied to a substrate 1, for example of the P-conductive type, this epi-layer 31 being subdivided into a first zone for transistor Tp71 and a second zone for the transistors Tn72 and Tn82 by means of separation insulation 8. Three P+ regions are introduced into the N-epi-layer of the first zone, the middle region of which is provided as the emitter and the adjacent regions of which are provided as the collectors of the double collector transistor Tp71.

Two P+ regions 44 and 45 are introduced in the second zone and an N+ region 51 or 52 respectively is also introduced in the second region such that it is encircled like a trough by the P+ regions 44 or 45 respectively. The P+ regions are the base regions of the transistors Tn72 and Tn82 constructed as vertical NPN transistors, the emitter of the transistors Tn72 and Tn82 being the N+ region 51 or 52 respectively encircled by the P+ region.

In addition, an N+ layer 20 or 21 respectively (the so-called buried layer) is provided in the individual regions between the substrate 1 and the N-epi-layer 31. This layer 20 or 21 prevents undesirable substrate currents in the region of the transistor Tp71. In the region of transistors Tn72 and Tn82, it reduces the collector track resistance of the transistors Tn72 and Tn82 which are operated vertically there.

The terminals of the respective transistors are designated E=emitter, B=base and C=collector in FIG. 3 and the connections in accordance with FIG. 2 can be gathered easily from FIG. 3.

As a comparison with FIG. 1 shows, the resistor R2 and the transistor Tp8 are not necessary in the circuit proposed. Only a single insulating box (above the N+ layer 21) is necessary for transistors Tn72 and Tn82 as FIG. 3 shows. As the result of these two features, the saving in area of the composite circuit is approximately 40% without having any effect on its electrical function.

Figure 4:
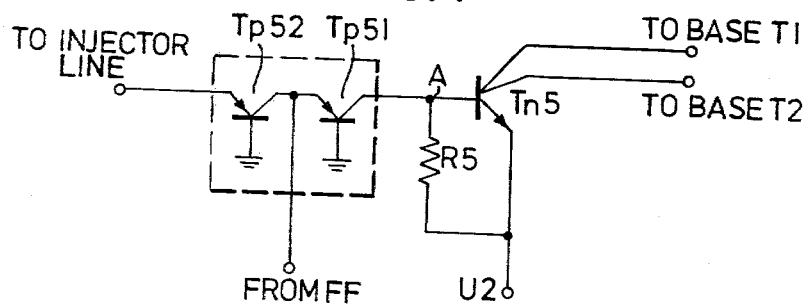
FIG. 4 shows an additional circuit for low resistance triggering for the purpose of blocking the two through switching transistors of a symmetrical cross point.

The refined additional circuit of the interface circuit of the invention is shown in FIG. 4. As can be seen, the additional circuit Z5 has a double collector transistor Tn5 of the NPN type. It is connected by means of one collector in each case to the respective bases of the two through switching transistors T1 and T2. In accordance with the invention a series connection of two PNP transistors Tp51 and Tp52 applied by their bases to reference potential is provided in which the collector of the first PNP transistor Tp51 is connected to the base of the double collector transistor Tn5, the emitter of the first PNP transistor is connected to the trigger stage FF and the collector of the second PNP transistor Tp52 and the emitter of the second PNP transistor Tp52 is connected to an injector line (which is apparent from FIG. 1).

The voltage U2 amounts to approximately −3 V with respect to the reference potential. The resistor R5 which can be carried out in an integrated circuit as a pinch resistor has a value of approximately 30 kΩ.

If the trigger stage switches the connecting point of the two PNP transistors to earth potential, then the transistor Tp51 and thus also the double collector transistor Tn5 are blocked.

On the other hand, with a blocked trigger stage, the injection current flows through the transistors Tp52 and Tp51 to the base of the double collector transistor Tn5 and, as a result, switches the base connections of the two through switching transistors in low resistance manner over to the operating voltage U2, whereby the through switching transistors are blocked in low resistance manner.

Figure 5:
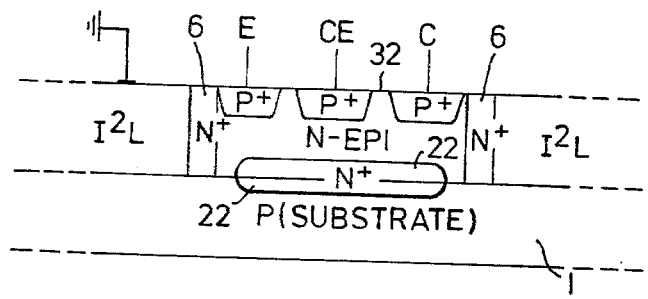
FIG. 5 shows the technological construction of the additional circuit shown in FIG. 4.

FIG. 5 shows the space-saving technological construction of the circuit shown in FIG. 4 in accordance with I²L technology. A N+ layer is applied to the substrate 1 as a buried layer and a N-epi-layer is arranged thereabove. A depth of N+ diffusion 6 surrounds the region of the two PNP transistors Tp51 and Tp52 so as to form a framework. Three P+ diffusions insulated from each other in this N-epi-region delimited in this manner are provided as emitters or collectors respectively of the two lateral PNP transistors Tp51 and Tp52, whereby the middle P+ region forms the connecting point of the collector of the transistor Tp52 with the emitter of the transistor Tp51. The base of both transistors is the N-epi-region 32. The N+ region 22 is lying thereunder and the substrate 1 is connected with the voltage U2.

As the broken line frame in FIG. 4 shows, only the construction of the two PNP transistors is shown in FIG. 5. However the method of integrating the lateral PNP transistor, which in FIG. 1 must be done in insulated manner, by means of the two PNP transistors shown in FIG. 4 has the advantage that additional diffusion of insulation is not necessary. Since, moreover, the base connections of the two PNP transistors are both at earth potential, both base regions can be joined together as FIG. 5 shows and can be integrated in I²L technology also without insulation diffusion. The space requirement of these two PNP transistors is approximately 0.005 mm² and as a result is 65% lower than that of an insulated lateral PNP transistor without impairing their function.

It will be understood that the above description of the present invention is susceptible to various modification changes and adaptations.

What is claimed is:

1. A monolithically integrated semiconductor circuit having a plurality of low resistance through switching transistors in accordance with bipolar technology for use in coupling arrangements having symmetrical cross points for telephone connection and transmission devices, which permits a series of incoming lines to be selectively connected to one or more outgoing lines in which the two through switching transistors respectively of a symmetrical cross point are constructed as NPN transistors and can be switched through in a high resistance manner by means of a composite circuit and can be blocked in low resistance manner by means of an additional circuit, and the composite circuit and the additional circuit can be triggered by means of a memory constructed as a trigger stage, characterized in that the composite circuit has a double collector transistor of PNP type, a collector of which is connected to the base of a first NPN transistor, the other collector being connected to the base of a second NPN transistor, its emitter being connected, on the one hand, to the collectors of both NPN transistors and on the other hand via a first resistor to a voltage source and its base being connected, on the one hand, via a component causing a constant drop in voltage to said voltage source and, on the other hand, via a second resistor to the trigger stage and the emitters of the two NPN transistors respectively are connected to the bases of the two through switching transistors.

2. A monolithically integrated semiconductor circuit for coupling arrangements having symmetrical cross points comprising two through switching NPN transistors; a composite circuit for switching through said through switching transistors, including a double collector PNP transistor, a first NPN transistor having its base connected to a first collector of said double collector transistor, a second NPN transistor having its base connected to the second collector of said double collector transistor, means for connecting the emitter of said double collector transistor to the collectors of said first and second NPN transistors, a resistor connecting said emitter of said double collector transistor to a voltage source, a component causing a constant voltage drop connected between the base of said double collector transistor to said voltage source, a second resistor connected to said base of said double collector transistor and means for connecting the emitters of said first and second NPN transistors respectively, to the bases of said through switching transistors; an additional circuit for blocking said through switching transistors in cooperation with said composite circuit; and a trigger stage memory circuit for triggering said additional circuit and connected to said second resistor of said composite circuit.

* * * * *